(12) United States Patent
Burke et al.

(10) Patent No.: US 7,033,929 B1
(45) Date of Patent: Apr. 25, 2006

(54) DUAL DAMASCENE INTERCONNECT STRUCTURE WITH IMPROVED ELECTRO MIGRATION LIFETIMES

(75) Inventors: Peter A. Burke, Portland, OR (US); William K. Barth, Gresham, OR (US); Hongqiang Lu, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 241 days.

(21) Appl. No.: 10/328,333

(22) Filed: Dec. 23, 2002

(51) Int. Cl.
*H01L 21/4763* (2006.01)

(52) U.S. Cl. .................. 438/638; 438/618; 438/672; 438/640

(58) Field of Classification Search .............. 438/618, 438/634, 638, 640, 672
See application file for complete search history.

(56) References Cited

U.S. PATENT DOCUMENTS 6,207,577 B1 * 3/2001 Wang et al. .............. 438/706
6,211,063 B1 * 4/2001 Liu et al. .................. 438/624
6,271,117 B1 * 8/2001 Cherng ..................... 438/624
6,294,465 B1 * 9/2001 Hernandez et al. ......... 438/669
6,461,955 B1 * 10/2002 Tsu et al. .................. 438/618
6,482,733 B1 * 11/2002 Raaijmakers et al. ....... 438/633

* cited by examiner

*Primary Examiner*—Amir Zarabian
*Assistant Examiner*—Pamela E Perkins
(74) *Attorney, Agent, or Firm*—Beyer Weaver Thomas

(57) ABSTRACT

A dual damascene interconnect structure is formed by patterning a first dielectric to form a metal line. A second dielectric is disposed on the first dielectric and patterned to form a via. The first metal line is patterned in a configuration relative to a via landing so that a cavity is formed when the via etch into the second dielectric is extended into the first dielectric. The cavity is filled with a conductive metal in an integral manner with the formation of the via to form a via projection for improved electrical contact between the via and the metal line.

25 Claims, 8 Drawing Sheets

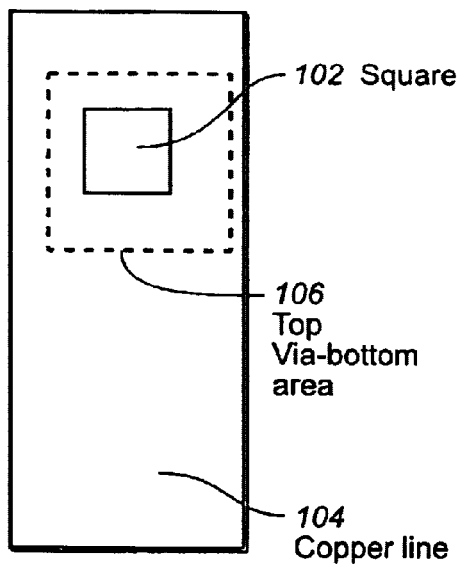
FIG._1A
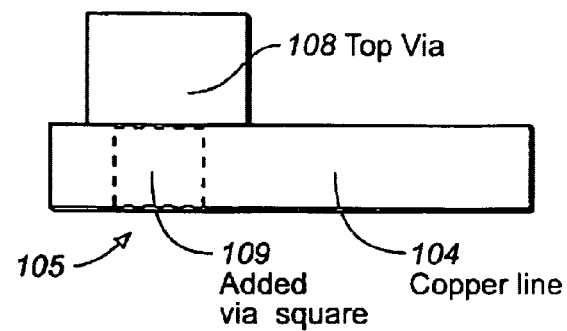
FIG._1B
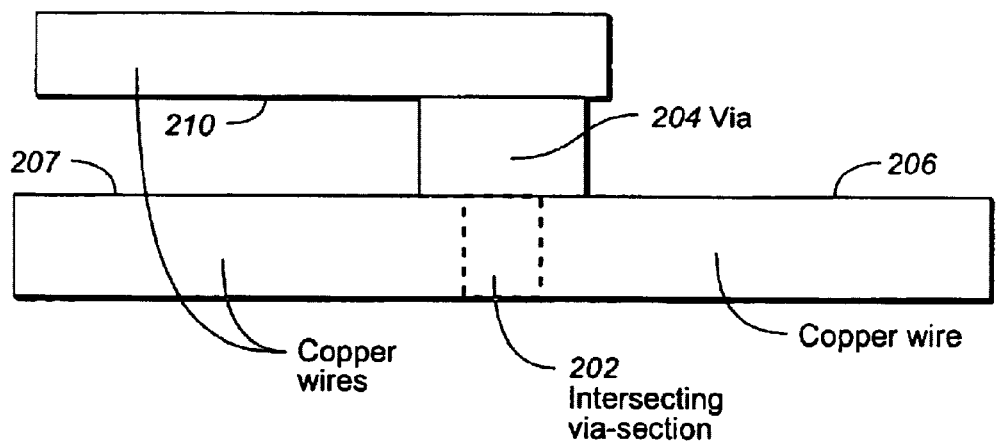
FIG._2

FIG._3A
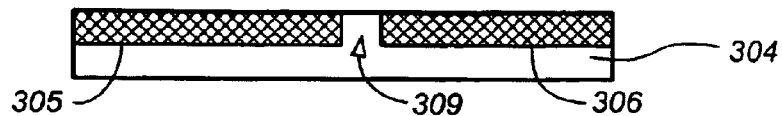
FIG._3B
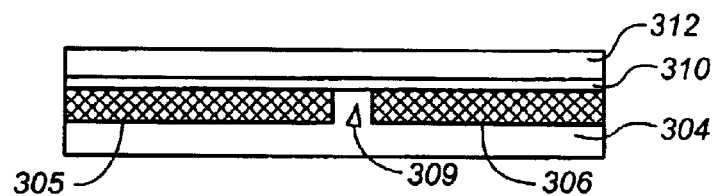
FIG._3C
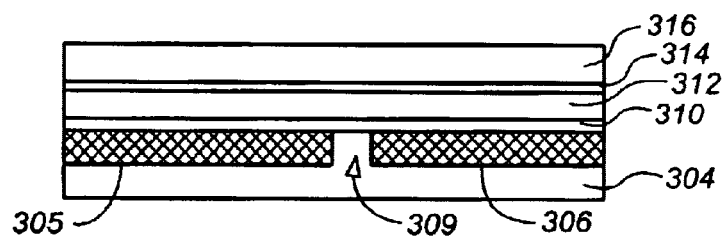
FIG._3D
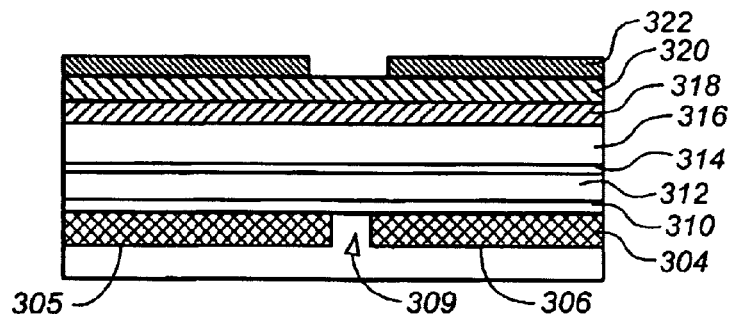
FIG._3E
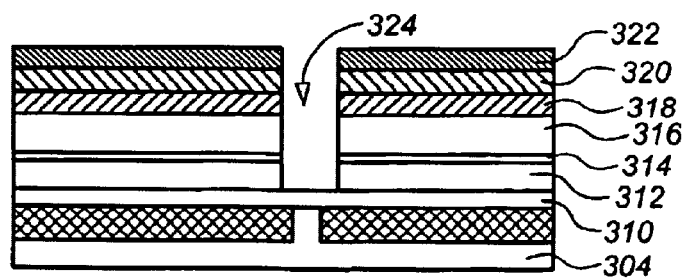

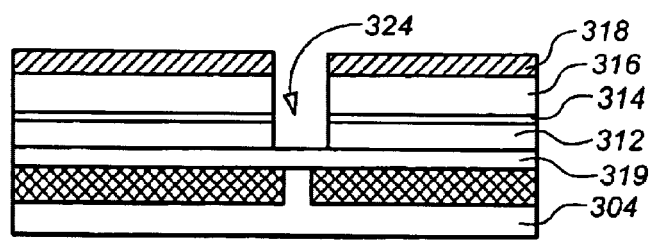
FIG._3F
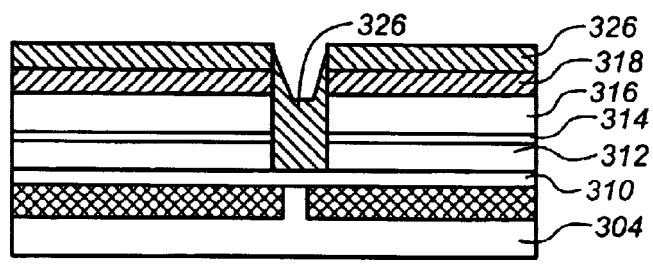
FIG._3G
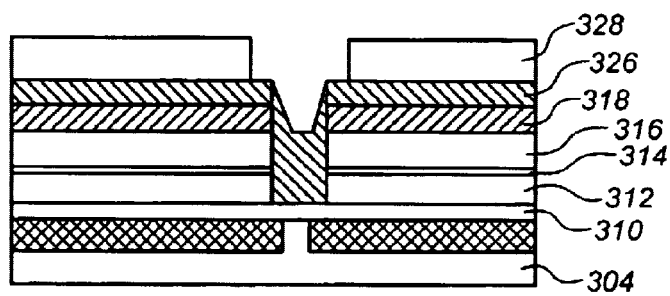
FIG._3H
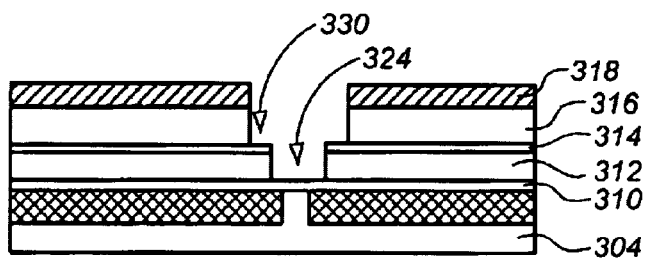
FIG._3I
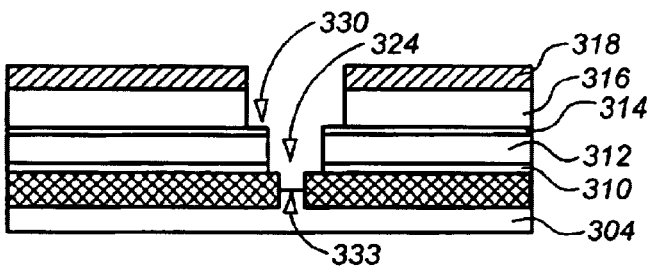
FIG._3J
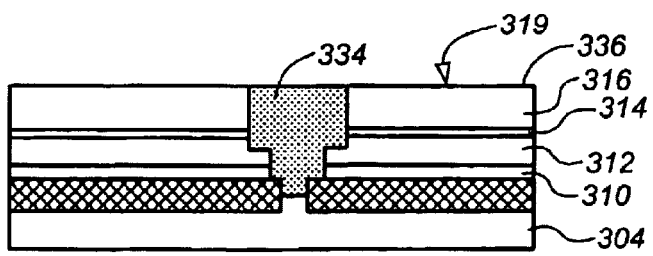
FIG._3K

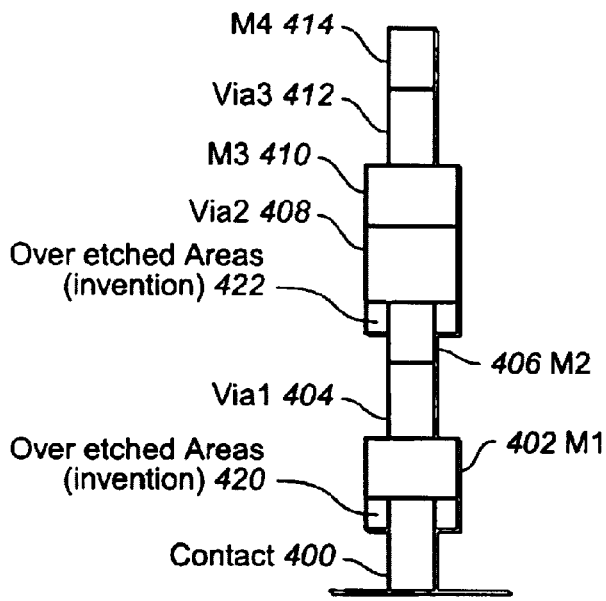
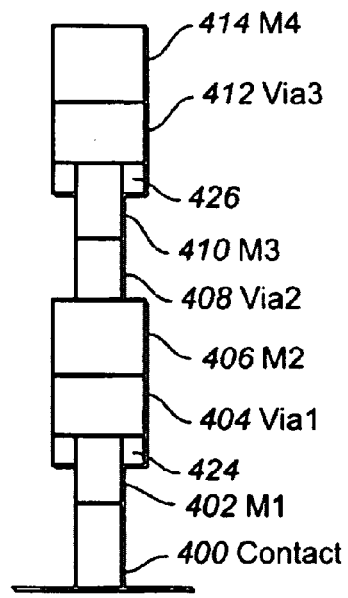
FIG._4A  FIG._4B
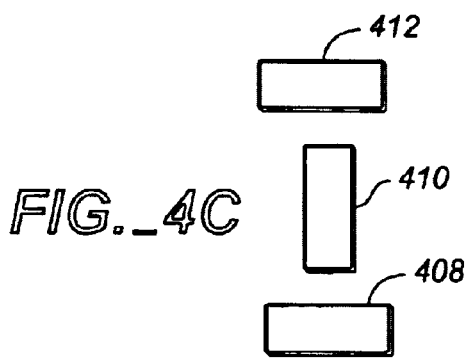
FIG._4C
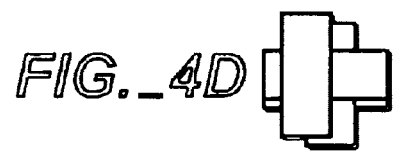
FIG._4D
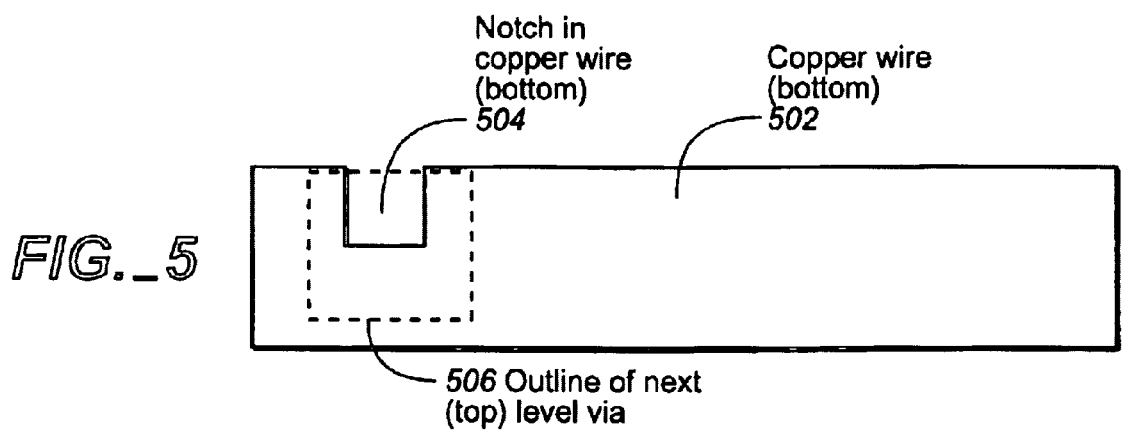
FIG._5

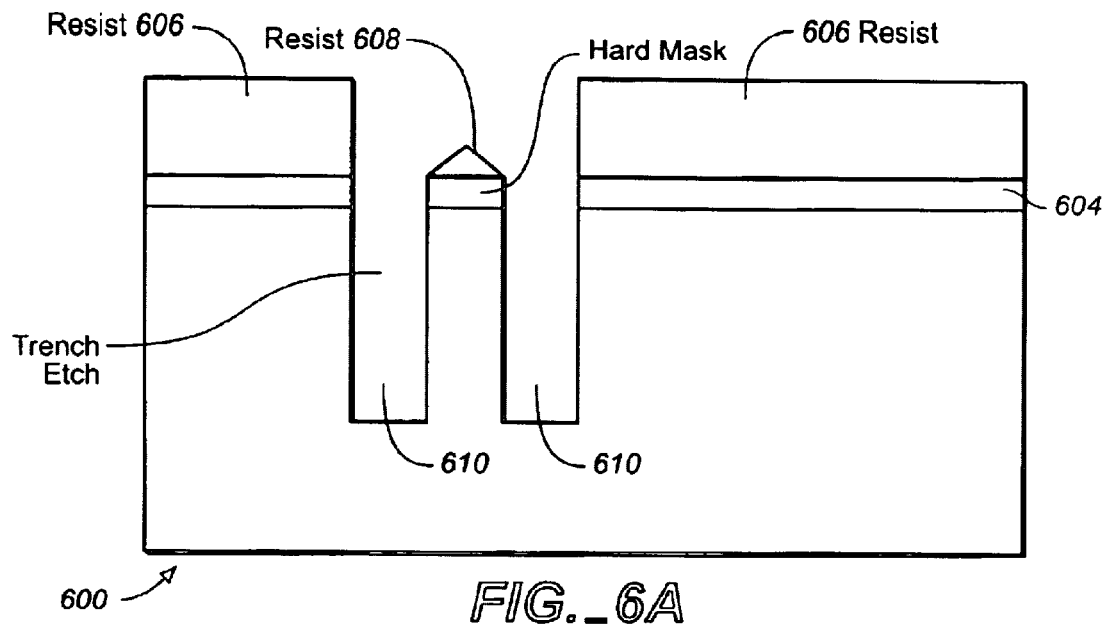
FIG._6A
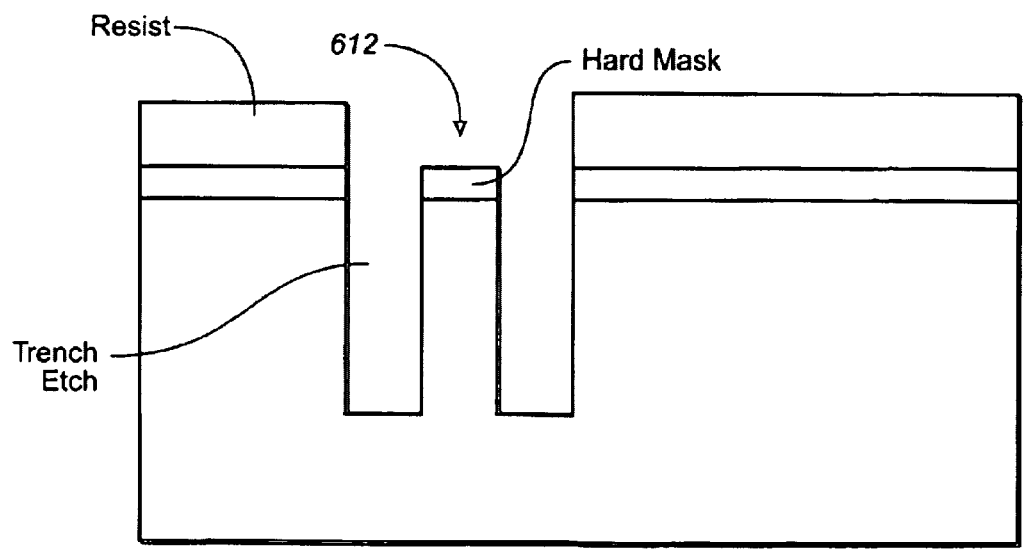
FIG._6B

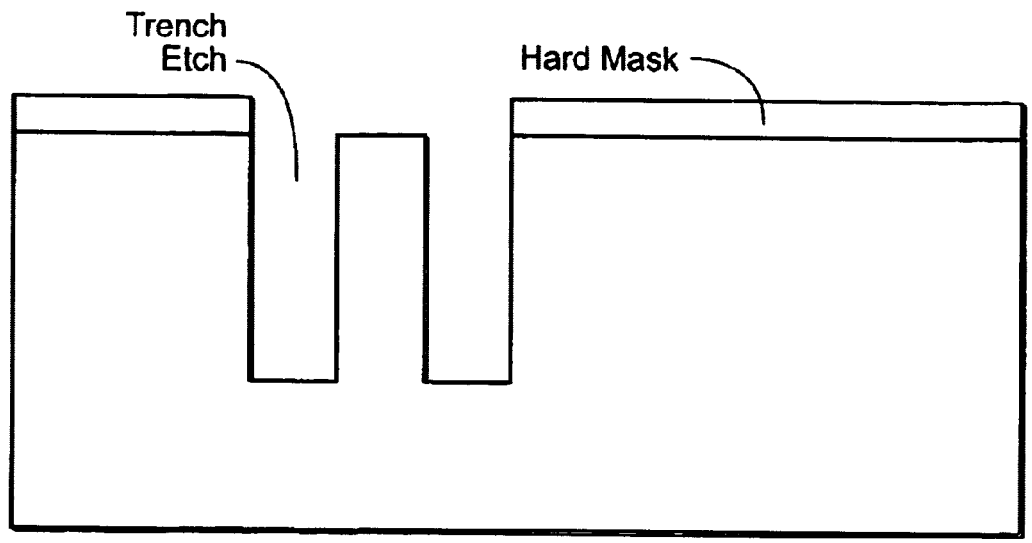
FIG._6C
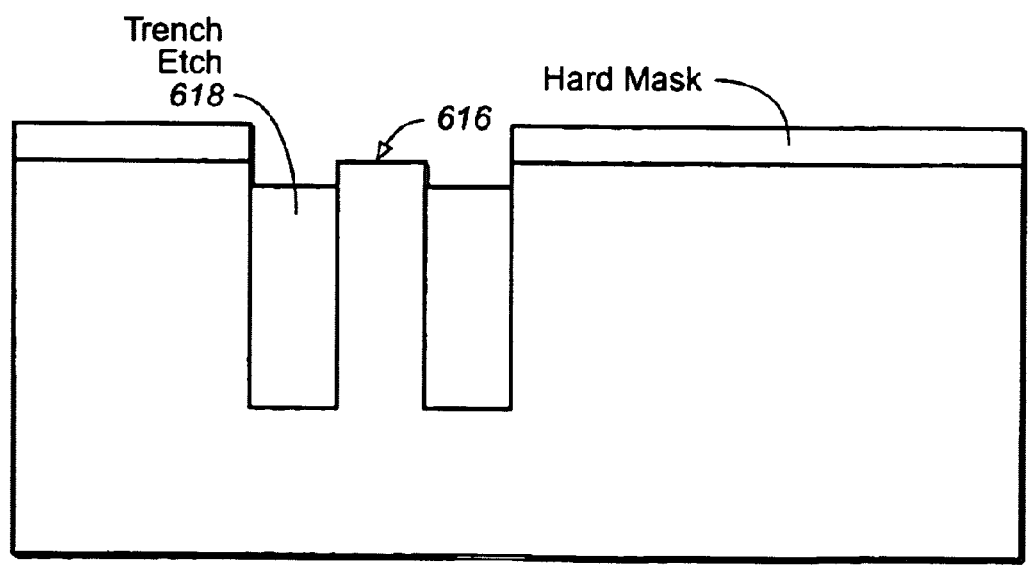
FIG._6D

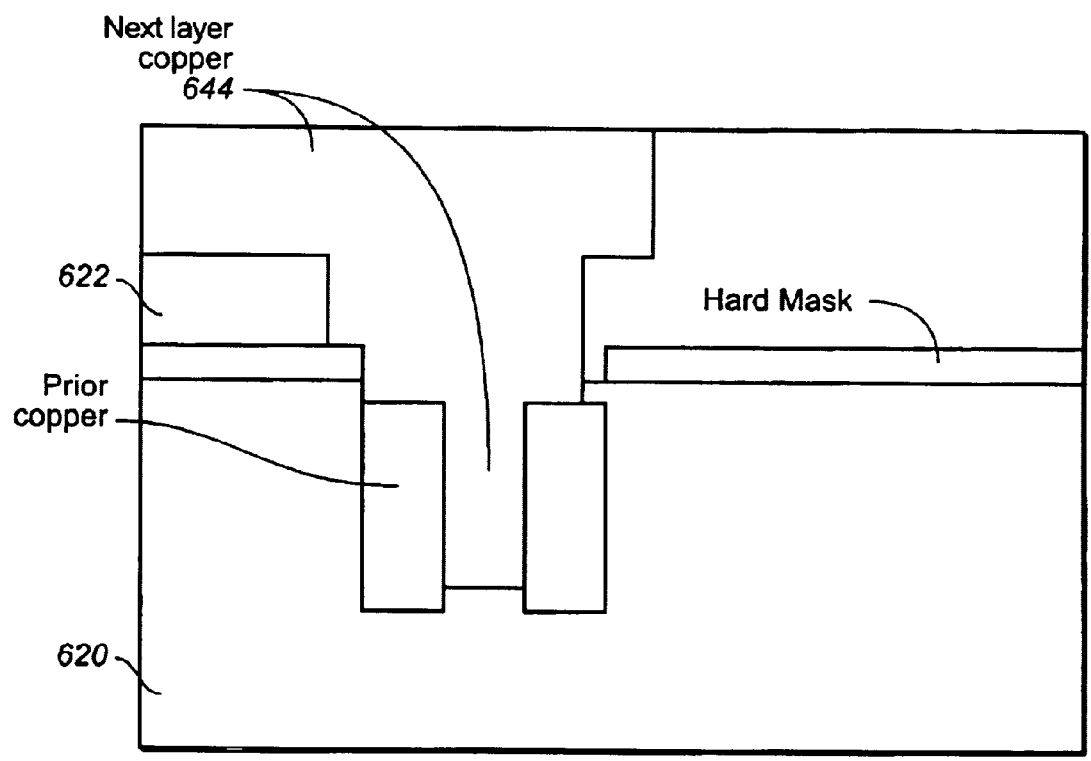
FIG._6E
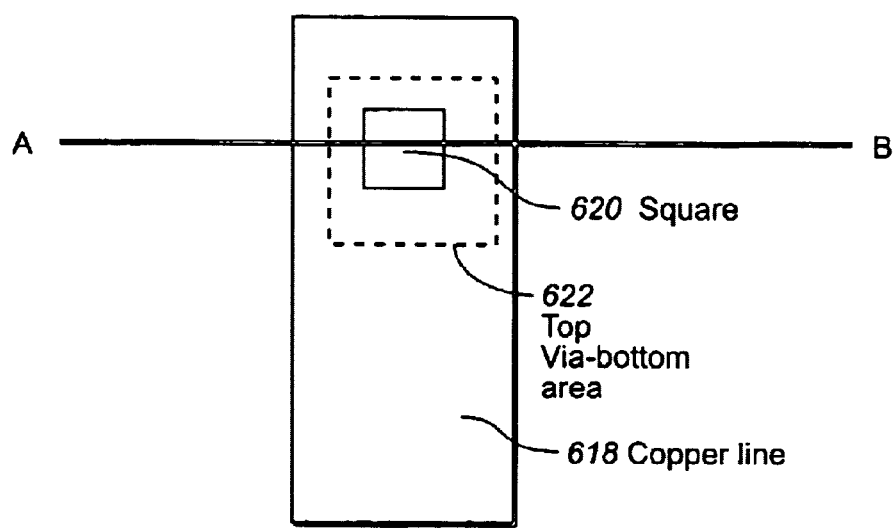
FIG._7

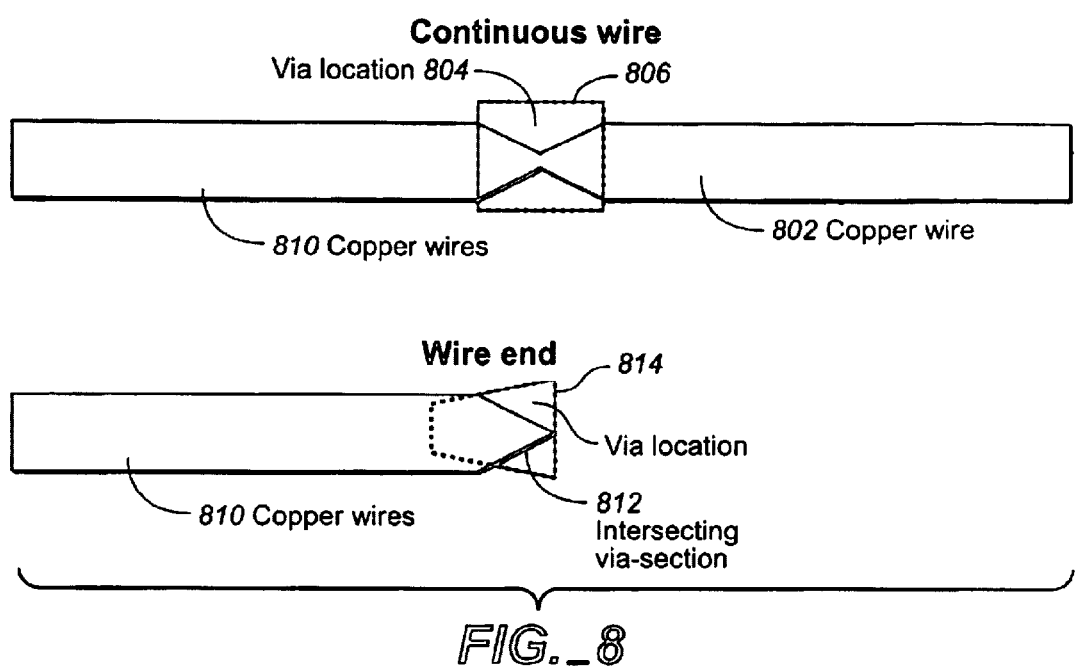
FIG._8

DUAL DAMASCENE INTERCONNECT STRUCTURE WITH IMPROVED ELECTRO MIGRATION LIFETIMES

BACKGROUND OF THE INVENTION

1. Field of the Invention

The present invention relates to the formation of metal interconnections on semiconductor wafers. More particularly, the present invention relates to the formation of dual damascene interconnects with improved electro migration lifetimes.

2. Description of the Related Art

As integrated circuit devices grow smaller and smaller, higher conductance and lower capacitance is required of the interconnects. In order to accommodate these objectives, the trend has been towards the use of copper for interconnects and damascene methods for forming the interconnects. One drawback to the use of copper in the interconnects and metallization conductor is its tendency to diffuse (i.e., leakage) into adjacent dielectric layers. Copper diffuses easily into dielectric layers and diminishes the electrical insulation qualities of the dielectric.

Copper barrier layers, for example layers containing tantalum, have been deposited before the deposition of copper to prevent "leakage". This barrier layer must be able to prevent diffusion, exhibit low film resistivity, have good adhesion to dielectric and Cu and must also be CMP compatible. Also the layer must be conformal and continuous to fully encapsulate Cu lines with as thin a layer as possible. Due to higher resistivity of barrier material, the thickness should be minimized for Cu to occupy the maximum cross-sectional area.

Failures due to electromigration are also major reliability concern for the use of copper in forming interconnects. Electromigration is the current induced diffusion of atoms due to the momentum transfer from moving atoms. Electromigration may result in voiding and thus open circuit failures. Currently, the reliability of copper interconnects, i.e., the electro-migration lifetimes of CU-dual damascene interconnects, are limited by voids formed at the top-via to bottom metal interface. These voids are typically caused by electromigration and stress migration. Although such voids may be present at various portions of the conductive metal lines, when these voids coincide with the via—bottom metal interface, the via connection fails or becomes highly resistive. That is, the presence of such voids make the multi-level metallization layers vulnerable to failure by producing open circuits at the interface where one metal level contacts another. These voids are influenced by a number of factors including the barrier layers, seed layer quality, copper fill, thermal processing history and CMP performance.

Current approaches to these interface void problems include using multiple contacts to increase the electro migration lifetime from 50% to 100%. For example, second and third redundant vias are added. But this method requires more area for layouts. Moreover, stacked vias may not be permitted if the design tool rules are enforced. An alternative approach adds top shunts to the copper wiring. That is, a shallow layer of a second conductive material is added. But this adds extra processing steps and feasible manufacturing processes to incorporate these steps have not yet been developed. Yet another alternative approach involves alloying the copper. For this approach a suitable alloy that meets the electro migration objectives without severely impacting the copper wire bulk resistance has yet to be found.

Accordingly, what is needed is better methods and structures for forming top-via to bottom metal contacts in such a manner as to avoid electro migration problems.

SUMMARY OF THE INVENTION

To achieve the foregoing, the present invention provides methods and structures for forming top-via to bottom metal contacts in a manner that avoids electro migration issues. That is, the top-via and bottom metal are formed so that the barrier metal has a significant contact area with the barrier metal from the lower copper wire.

In one embodiment, the dual damascene process forms a metal line with a residual dielectric portion formed in the metal line at the area selected for a via-wire connection. During the via etch step, the residual portion is etched to approximately the bottom of the wire. The barrier metal deposition (BMD) step for the copper wire and the BMD for the subsequently formed via are directly in contact with each other in this formed cavity.

In another embodiment, a method of forming a dual damascene interconnect structure is provided. A first dielectric layer is formed on a substrate. The first dielectric layer is patterned and a conductive metal layer is deposited to form a first metal line at the top surface of the first dielectric. A second dielectric layer is formed on the first dielectric layer and patterned and etched to form a via in the second dielectric layer. The via etch is extended into the first dielectric layer to form a cavity extending beneath the bottom surface of the via formed in the second dielectric. A conductive metal layer is deposited in the via and the cavity to form a via and a via projection. The via projection makes electrical contact with a side of the first metal line.

In another embodiment, the first dielectric is patterned to form two metal lines with a gap between the metal lines. The patterned layer is configured so a via formed in a second dielectric layer overlies at least part of the gap. The etching of the via in the second dielectric layer is extended into the gap location of the first dielectric layer to form a cavity. The cavity is filled in an integral step with the via to form a via projection. In one aspect, the via projection is formed from copper and a barrier metal layer deposited prior to the copper makes direct electrical contact with a barrier metal applied prior to the deposition of copper used for the first metal line.

These and other features and advantages of the present invention are described below with reference to the drawings.

BRIEF DESCRIPTION OF THE DRAWINGS

FIGS. 1A–1B are diagrams illustrating top and side views respectively of a structure for connecting a top-via to a bottom metal contact in accordance with a first embodiment of the present invention.

FIG. 2 is a diagram illustrating top and side views of a structure for connecting a top-via to a bottom metal contact in accordance with a second embodiment of the present invention.

FIGS. 3A–3K are diagrams illustrating stages in the via-first dual damascene process of forming a semiconductor integrated circuit in accordance with the second embodiment of the present invention.

FIGS. 4A–4D are diagrams illustrating top and side views of a structure having stacked vias for connecting a top-via to a bottom metal contact in accordance with a third embodiment of the present invention.

FIG. 5 is a diagram illustrating a top view of a structure for connecting a top-via to a bottom metal contact in accordance with a fourth embodiment of the present invention.

FIGS. 6A–6E are diagrams illustrating stages in the process of forming a top-via to a bottom metal contact in accordance with a fifth embodiment of the present invention.

FIG. 7 is a diagram illustrating a top view of a structure for connecting a top-via to a bottom metal contact in accordance with a fifth embodiment of the present invention.

FIG. 8 is a diagram illustrating a top view of a structure for connecting a top-via to a bottom metal wire in accordance with a sixth embodiment of the present invention.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides interconnect structures and methods for forming a reliable interconnect structure between a via and a bottom metal wire in an interconnect metal level in the fabrication of an integrated circuit. In order to avoid electromigration issues, i.e., shortened electromigration lifetimes, the present invention provides in various embodiments significant contact areas between the barrier metal from the top via and the barrier metal from the lower copper wire. That is, according to embodiments of the present invention, the electromigration issues created by voids appearing at the interface between the top via and bottom metal line are reduced by providing redundant contact areas between the via and the metal line. Specifically, in one embodiment, after the via is etched the etch is extended to form a cavity in the underlying dielectric layer. When the cavity is filled in the same process step as the via, an integrally formed via projection makes electrical contact with the sides of the bottom metal line. Preferably, the barrier metal dielectric for the via projection makes direct electrical contact with the barrier metal for the first metal line.

It is common for an integrated circuit to include multiple interconnect layers to connect the various devices on the integrated circuit. After each metal layer is deposited, a series or network of metal interconnect lines (wires) is formed in the metal layer. A preferable method of patterning the metal layers involves damascene techniques. Briefly, a network of grooves or channels is formed in the dielectric layer. A conductive metal is then deposited in the grooves. A subsequent polishing operation such as chemical mechanical polishing (CMP) forms a planarized surface on the dielectric layer and reduces the top level of the metal lines to the planarized surface of the dielectric.

In dual-damascene processes, both metal lines and metal vias are cut into dielectric layers and then filled with the conductive metal. That is, in order to create the metal lines, trenches or channels are cut into the dielectric, to be later filled with an inlaid metal such as copper. Also, the holes or vias are cut to connect one layer of metal to the overlying or underlying metal layer or transistor contact. In this process, the trenches for the metal lines and the holes for the vias connecting one layer of metal lines (wires) to another are filled in the same step. The resulting interconnect layer thus includes a metal line overlying a via for connecting the metal line to an underlying transistor contact or interconnect layer, preferably a metal line or stacked via in the interconnect layer.

For discussion purposes, the top via and bottom metal line refers to a via formed in a dielectric layer overlying a lower interconnect layer having a metal line (i.e., the bottom metal line). For example, dual damascene processes typically form a trench and via, the trench and via later filled with conducting metal to form a metal line and a conducting via extending form the bottom surface of the metal line formed by filling the trench. Thus, in terms of relative placement, the so-formed metal line and via are a top metal line and a top via, whereas the metal line in the underlying dielectric layer (to which the via extends) is a bottom metal line.

In copper dual damascene interconnects, failures tend to occur frequently at the interface between the bottom of the via and the top of the metal line of the underlying interconnect layer. That is, voids may appear at the top of the metal line. These voids may result in device failure or high resistivity in the via.

To reduce the operational and reliability problems resulting from these voids, embodiments of the present invention provide increased contact areas between the barrier metals surrounding the interconnect layer vias and the barrier metals of the underlying metal line, i.e., the bottom metal line.

In a first embodiment, a small square of dielectric is left in the metal wire in the area desired for via-wiring connections. During the via etch, the dielectric material is etched to nearly the bottom of the copper wire. As a result, the barrier metal deposition (BMD) for the copper wire and the BMD for the subsequent formed via are directly in contact with each other. That is, the etching of the residual dielectric "island" or "square" in the copper wire results in a cavity formed in the metal wire (i.e., the bottom metal line) and effectuating electrical connection between the via and the metal line when the via and metal line are filled with conductive metal. This arrangement provides greater contact areas than conventional via-metal wire interface connections.

FIGS. 1A–B are diagrams illustrating top and side views of a structure for connecting a top-via to a bottom metal contact in accordance with a first embodiment of the present invention. In the top view (FIG. 1A), a dielectric "square" location 102 is shown formed in the metal line (copper line) 104. For illustrative purposes, the top via is removed, but its location represented by the top-via bottom area 106 (i.e., a via landing) outlined in dashed lines. In the side view of FIG. 1, the top via 108 is shown positioned over the corresponding dielectric square location of the metal line 104. For clarity of illustration, the dielectric material in which the via 108 is formed is shown removed. Moreover, the side view shown in FIG. 1B, shows a via projection 109 (i.e., an added via square projection) extending from the via 108 into the void left after etching of the dielectric square 102.

It should be appreciated that although the dielectric portion of the metal line 104 which is designed to receive the via projection 109 is described as a square, the invention is not so limited. The embodiment of the present invention applies to all shapes of the projection suitable for providing increased contact between the via and an underlying metal line cavity. Thus, the cross section of the projection (i.e., as viewed from above the via) and the corresponding dielectric portion used in the process of forming the projection may be in a circular shape, a triangular shape or any other polygon or other shape without departing from the scope and spirit of the present invention. Moreover, the width of the projection and the corresponding cavity may be any width sufficient to allow void free deposition of the fill material. For example, the square may preferably have a width of 5 to 700 nm, more preferably from 200 to 600 nm. The depth of the cavity relative to the depth of the metal line is preferably greater than 5% of the depth of the bottom metal line, more preferably from 80 to 100% of the depth of the metal line.

Thus, embodiments of this invention describe methods and structures for making better top-via to bottom metal contact in such a manner to avoid electro-migration issues. As can be appreciated by those familiar with dual damascene processes, barrier metals are typically employed to prevent diffusion of copper into surrounding dielectric regions. Thus according to several embodiments of the present invention, by forming the via projection in the cavity as described, the barrier metal from the top via has a significant contact area with the barrier metal from the lower copper wire. That is, the barrier metal deposition ("BMD") from the copper wire and later formed via are directly in contact with each other. Accordingly, in the event of copper void formation, the BMD-copper wire shunts are still connected so that the wires do not fail.

In a second embodiment, the copper wire in the underlying dielectric is drawn with a gap between the metal lines. The gap is completely filled when the top via is formed by filling. That is, the etching of the top via is extended into the lower dielectric layer to form a cavity defined in part by the sides of the two metal lines. Later, in the via fill step, the cavity is completely filled to form a via projection that is integral with the filled via In this case the via BMD and copper-wire BMD or shunt come in direct contact on the edges of the via and the wire (line) ends. Similar to the first embodiment, the barrier metal to wiring shunt contact will provide a conductive pathway in the event of a copper void.

FIG. 2 is a diagram illustrating top and side views of a structure for connecting a top-via to a bottom metal contact in accordance with the second embodiment of the present invention. As illustrated, a via projection 202 extends form the via 204 to fill the gap created between bottom metal wire 206 and 207. Metal wire 210 and via 204 are commonly formed in one fill process according to conventional dual damascene techniques. That is, metal line 210 may be formed by filling a trench and via 204 by filling a via in a conventional damascene process such as the via-first approach.

FIGS. 3A–3K are diagrams illustrating stages in the via-first dual damascene process of forming a semiconductor integrated circuit in accordance with the second embodiment of the present invention. The process begins, as shown in FIG. 3A, with an interconnect metal layer 305, 306 formed by damascene methods. As described with respect to the second embodiment, a gap 309 is formed between the ends of the metal lines 305, 306 inlaid in the first dielectric layer 304.

The process continues, as shown in FIG. 3B, with the formation of a barrier layer 310 containing, for example, silicon nitride or silicon carbide, over the first metal layer 305, 306. The barrier layer 310 may be formed by plasma enhanced chemical vapor deposition ("PECVD") methods.

Formation of the barrier layer is followed by a deposition of a low-k dielectric film. The thickness of the first barrier layer 310 may be varied in order to optimize the resistance of the barrier to copper diffusion according to methods known to those of skill in the relevant art. A dielectric layer, preferably a low-k dielectric layer 312 is then formed over the dielectric stack (304, 305, 306, and 310) as shown in FIG. 3B. The low-k dielectric layer 312 may be formed by various methods known to those of skill in the art, including a PECVD process, a spin-on process, and a flow-fill process. The low-k dielectric layer may be SiCOH or some other dielectric composition formed using silicon, carbon, oxygen and hydrogen, such as are known in the art. Low-k materials exhibit increased porosity in comparison to conventional silicon oxide dielectric layers. Such low-k dielectric materials may exhibit k values of 2.8 or lower (compared to conventional dielectrics (e.g. $SiO_2$) which exhibit k values of about 4.0 or more). For example, low-k organosilicate films have shown k values ranging from 2.6 to 2.8. Low-k dielectrics are well known in the art and are discussed, for example, in "Designing Porous Low-k Dielectrics," Semiconductor International (May 2001), incorporated by reference herein in its entity.

An etch stop layer 314 is then deposited on top of the low-k dielectric layer 312 as shown in FIG. 3D. The etch stop layer 314 is selective to the low-k dielectric material. Nitrogen-free SiC materials are commonly used as etch stops. As shown in FIG. 3C, a second low-k dielectric layer 316 is then deposited on top of the etch stop 314 to facilitate fabrication of the dual damascene structure. A capping layer 318 is then deposited over the second low-k layer 316. The capping layer 318 may comprise any material suitable for protecting the fragile low-k layer during CMP. For example, $SiO_2$ may be used for the capping layer. A BARC layer (bottom anti reflective coating) 320 may then be deposited on the top capping layer 318 to provide improved resolution during photolithography.

A photoresist layer is then deposited on the stack as shown in FIG. 3D, and patterned to form a mask 322. A via 324 is etched through the BARC layer 320, capping layer 318, two low-k dielectric layers 312 and 316 as well as etch stop 314 (See FIG. 3E). This may be achieved through the use of an anisotropic etch such as a plasma dry etch.

The photoresist mask 322 and BARC layer 320 is removed following formation of the via. A BARC layer (bottom anti reflective coating) 326 may then be deposited in the via 324 and on the top surface of the stack to protect the bottom barrier layer of the via from opening during trench etch (and having the underlying copper sputtered). The BARC layer 326 may be etched back to partially fill the via hole then reapplied to the precise thicknesses need for photolithography. Then a second photoresist layer 328 is deposited to pattern and etch a trench.

Continuing with the process of the present invention, the second photoresist layer 328 is patterned and etched to form the trench 330 as shown in FIGS. 3H and 3I. Etching stops on the etch stop layer 314 to form the trench and via structure shown in FIG. 3I. In subsequent steps, the photoresist mask 328 is removed as well as the barrier layer 310 (open barrier etch) adjacent to the metal layer 305, 306. Etch gases for performing an open barrier etch are well known to those of skill in the relevant art and will not be described further here. These are typically low energy etches, for example, using gas mixtures containing $CF_4$ or similar. Thus, when the etch penetrates the barrier layer 310, any exposed copper in metal lines 305, 306 will not significantly sputter into the via. The etch continues into the low k-layer 304, preferably limited to the gap 309 between the metal lines 305, 306 until the cavity 333 is formed. Thus, the cavity may be formed in the same barrier open etch step or with an additional low energy step immediately after the barrier open etch step. Preferably, the cavity 333 extends a distance below the top surface of the metal lines of about 5% or more of the depth of the metal lines, although any depth of penetration below the top surface of the metal lines in this or the other embodiments is expected to be advantageous. More preferably, the cavity is formed by extending the etch to a depth of 80 to 100% of the depth of the metal lines 305, 306.

According to standard processing techniques, the via and trench will typically then be filled first with a barrier metal layer (not shown), such as for example, tantalum, tantalum nitride, Pd, WN or TiN and then with a copper seed layer either by PVD, iPVD, SIPVD, MOCVD, electroless, ALD or direct plating methods. Finally the copper is filled by electrochemical deposition or electroplating, as illustrated in FIG. 3K, to form copper interconnect 334. FIG. 3K also illustrates the interconnect structure following chemical mechanical polishing (CMP). That is, the deposited copper and the capping layer 318 are polished to form a planarized surface 319 and the removal of the capping layer 318 is effectuated by the polishing.

The foregoing process, as specifically illustrated in FIGS. 3A–3K, describes the formation of a trench structure according to a "via first" process in accordance with one embodiment of the present invention and specifically describes one method of using the via-first approach. The via first sequence is but one of several dual damascene approaches to connect one layer of metal to the overlying or underlying metal layer or transistor contact. The embodiments of the present invention are applicable to any dual damascene technique, such as are well known in the art. A review of dual damascene processing techniques in provided in the article "Dual Damascene: Overcoming process issues," Semiconductor International (June, 2000), incorporated by reference herein in its entirety. For example, two alternative dual damascene processes are "trench first" and a self-aligned process ("buried via"). The steps of the process described above are provided as an example. Given the guidance provided by these steps, one skilled in the relevant art could apply the steps to the various configurations described throughout the specification to form the structures using various damascene and dual damascene processes and thus the scope of the invention is not intended to be limited to the process steps described.

FIGS. 4A–4D are diagrams illustrating top and side views of a structure having stacked vias for connecting a top-via to a bottom metal contact in accordance with a third embodiment of the present invention. In the third embodiment, via to metal line contact, can be made by elongating or over sizing the via to overlap the sides of the metal line. In this case the via BMD will contact the wire shunt-side-walls. This formation is especially suitable for stacked via formations. As illustrated in FIG. 4A, Via1 (402), Via2 (408) and Via3 (412) each are oversized relative to the underlying metal lines M1 (402), M2 (406), and M3 (408). As shown, this may be achieved in one embodiment by rotating features for each line or via in succession. That is, preferably the lines and vias are rotated by 90 degrees relative to the preceding line or via. In this way, vias and metal lines having the same critical dimensions may be used to create an overlap between a via and an underlying metal line. For example, FIG. 4B illustrates the metal lines and vias of FIG. 4A from a side view, i.e., rotated 90 degrees from FIG. 4A. Over etched areas 422, 424, and 426 are formed by extending the respective via etches of Vias 404, 408, and 412 respectively. Thus by arranging the rectangular shaped (in cross-section) vias in orthogonal directions to the directions of the metal lines, the vias, at the via to metal line contact, will overlap the metal lines. That is, the via landing will no longer land entirely on the metal line. This feature enables etching of the via to be continued into the underlying dielectric to form a cavity on at least one side of the metal line, preferably on each of the two sides of the metal line. Thus, when the via is filled, such as in a dual damascene process, the conductive metal will also fill the cavity adjacent to the metal line and thus form a via projection. The via projection makes electrical contact with the sides of the metal line as described above with respect to the first embodiment, preferably by making contact between the respective barrier metal layers.

FIGS. 4C–4D illustrate top views of the stacked vias illustrated in FIGS. 4A–4B. FIG. 4C illustrates the orientation of respective metal lines and vias. For example, Via3 (412) is shown having a rectangular cross section when viewed from above. Metal line M3 (410) is shown oriented in a direction 90 degrees rotated from the longitudinal direction of rectangular Via3 (412). Thus, when the etching of Via3 takes place, the etch may be extended into the underlying dielectric (that in which M3 is formed) to form cavities which will later be filled to form via projections. It should be noted that FIG. 4C illustrates the example orientations of the layers, not the precise positioning of the lines and vias when viewed from the top of the interconnect stack. FIG. 4D illustrates an example of the stacked via when viewed from above the interconnect stack.

Although shown for illustration purposes with rectangular vias rotated relative to the general orientation of the metal lines, the scope of the invention is not so limited. The scope of the invention is intended to extend to all configurations wherein the via overlaps the metal line, such as including large circular vias positioned over relatively thinner metal lines.

In a fourth embodiment, similar to the first embodiment, the sides of the copper wires can have cuts or blocks taken out where a top via can intersect for BMD to shunt contact. FIG. 5 is a diagram illustrating a top view of a structure for connecting a top-via to a bottom metal contact in accordance with the fourth embodiment of the present invention. As illustrated, the dielectric layer containing metal line 502 (i.e. a first dielectric) is patterned so that the metal line 502 includes a notch 504 when the patterned dielectric is filled. That is, the inlaid metal line 502 will have a cavity formed within the general configuration of the metal line 502 at one side of the metal line. This cavity may be formed by extending the etch of the via from the second dielectric (i.e., the dielectric layer overlying the first dielectric layer) into the first dielectric layer, specifically into the notch defined by the metal line 502. The outline of the top level via 506 (i.e. via landing) is this shown falling on the metal wire 502 to include the notch 504. Although the notch 504 is shown as configured in a square shape, the invention is not so limited. The notch may be in any general shape which allows conductive metal used for the via fill process step to fill the cavity without creating voids. For example, as described with respect to the first embodiment, the shape may be rectangular, triangular, or circular. Moreover, the width of the notch may be any width sufficient to allow void free deposition of the fill material. For example, the notch may preferably have a width of 50 to 700 nm, more preferably from 150 to 300 nm. The depth of the cavity relative to the depth of the metal line is preferably greater than or equal to 5% of the depth of the bottom metal line, more preferably from 80 to 100% of the depth of the metal line Typical barrier metal layer thicknesses (BMD) for use with the via, via projection, and first metal line are from 15–20 nm. Typical dimensions for a metal line M1 are about 250 400 nm high (thick), and a via typically about 0.14–0.25 μm wide and between 250–500 nm deep. Although these dimensions are described for illustrative purposes for any and all of the described embodiments, they are not intended to be limiting.

FIGS. 6A–6E are diagrams illustrating stages in the process of forming a top-via to a bottom metal contact in accordance with a fifth embodiment of the present invention. In the fifth embodiment, the process is similar to the first embodiment, except in this case a dielectric stack 600 for the metal line includes both a top copper barrier (not shown) and a hard mask 604. In this embodiment, overlapping vias do not allow for the hard mask to be etched below the barrier material. For example, etching below the hardmask/barrier dielectric level has risks of shorting if the vias to metal are misaligned. By using the arrangement as described in the fifth embodiment, the self-aligned aspects of hard masks and cap layer processing may be kept while still getting overlap. In the metal layout, the only place a min×min dielectric feature box is only placed inside a metal line. Hence, the resist posts, i.e., such as the short photresist cap as shown in FIG. 6A, etch faster than the bulk.

The desired result is to have the center dielectric square's hardmask removed and the edge of the line's hardmask intact so that this center square of dielectric material may be etched away selectively. This may be accomplished, for example, by integrating the dielectric trench etch with this process where the trench lithography creates a shorter and possibly rounded resist cap for the squares' resist profile.

As illustrated in FIG. 6A, the dielectric stack 600 includes a first dielectric 602, hard mask 604, and patterned photoresist layer 606. The photoresist cap 608 is shown having a shorter profile than the remainder of the photoresist layer 608. Trench 610 is shown formed, such as in conventional damascene processes known to those of skill in the relevant art. Next, as illustrated in FIG. 6B, a short resist etch is performed to remove the photoresist cap 608. Due to the different layer thicknesses between the resist cap 608 and the remaining portions of the photoresist layer 606, the resist layer 606 remains after this short etch. In summary, as the etch consumes resist during the etch process, resist will be consumed for this squares' area before the line's edge.

Next, the trench etch can then be used to remove this dielectric square's hard mask as illustrated in FIG. 6C. That is, a short hard mask etch followed by a resist strip results in the removing of the hard mask portion 612 over the dielectric square and the removal of the resist from the stack. Copper deposition is then performed to fill the trench with a first copper layer 618 at a level recessed below the top surface 616 of the dielectric square (see FIG. 6D). That is, the copper lines will need to be recessed below the surface of the remaining dielectric, during the copper patterning process.

The via etch then penetrates through the copper barrier (not shown) then selectively remove the square's dielectric material. When the via is formed, this square will be filled with BMD (not shown) then copper (620, 622, 624), i.e., a second layer of copper, allowing for BMD to metal-wire shunt material contact. Thus, the via projection 620 is integrally formed with the via 622, as illustrated in FIG. 6E.

FIG. 7 is a diagram illustrating a top view of a structure for connecting a top-via to a bottom metal contact in accordance with a fifth embodiment of the present invention. That is, the sectional line "A"-"B", provides a reference location for the cross sectional diagram shown in FIG. 6E. The top view depicted includes metal line 618 and the via projection 620 formed respectively by the first and second copper layers described with reference to FIG. 6E. The top via bottom area 622' corresponds to the shape of the via 622 formed and illustrated in FIG. 6E.

FIG. 8 is a diagram illustrating a top view of a structure for connecting a top-via to a bottom metal wire in accordance with a sixth embodiment of the present invention. In the Sixth embodiment, ends of lines can be modified such that pointed ends or narrower lines are imaged, using such methods as optical proximity correction ("OPC") to form these images. After these Cu-lines are formed, overlapping vias can be used such that the via is wider than the narrowed portions of the line. The benefit of this embodiment is that existing lithography methods can be used to create locally narrowed lines which will allow for the refractory metal to refractory metal contact during Via formation. This embodiment can also be used on lines, even of minimum spacing so that a narrow portion of the line can be formed and via can either form the bridge between the lines as in embodiment 2 or the line can neck down and still be continuous with the overlapping Via shown by via outline 804. As illustrated, metal line 802 has a narrowed portion 806 to facilitate refractory metal to refractory metal contact between the via and the metal line 802. Shape divergences can be made in the lower line or the top-via to establish better overlap with better chances of being filled with BMD and Cu. As an example, metal line 810 may be configured with a triangular type line end 812 can be used with a truncated triangular via, pointed the other direction, as shown by via outline 814, and can lead to an easier to fill void between the line and the overlapping via.

All of the embodiments of the invention can be enhanced by the addition of a second via, as commonly used in the industry today. A second via cuts the current density for each via in essentially ½, thus raising the electromigration lifetime.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a dual damascene interconnect structure in a semiconductor integrated circuit, the method comprising:

forming a first dielectric layer on a substrate;

patterning the first dielectric layer and depositing a conductive metal layer to form a first metal line at the top surface of the first dielectric;

forming a second dielectric layer on the fist dielectric layer;

patterning and etching the second dielectric layer to form a via in the second dielectric layer;

extending the via etch a first distance into the first dielectric layer to form a cavity extending beneath the bottom surface of the via formed in the first dielectric;

depositing a conductive metal layer in the via and the cavity to form a via and a via projection having a means for improving electrical contract between the conductive metal layer.

2. The method recited in claim 1 further comprising depositing a barrier metal in the cavity before depositing the conductive metal layer in the via and cavity.

3. The method recited in claim 1 wherein the cavity is defined by at least one side of the metal line.

4. The method recited in claim 1 wherein the patterning of the cavity is defined at least in part by a feature patterned in the first metal line.

5. The method recited in claim 4 wherein the feature is an island of dielectric formed in the first metal line.

6. The method recited in claim 4 wherein the feature is a narrowed portion of the line, the narrowed portion formed by optical proximity correction (OPC) techniques.

7. The method recited in claim 1 wherein the feature is a cutout section formed along the side of the metal line.

8. The method recited in claim 5 wherein the island has one of square, circular, triangular, and rectangular shapes.

9. The method recited in claim 4 wherein the feature has a width of greater than 50% of the width of the metal line.

10. The method recited in claim 1 wherein the depth of the cavity is greater than 5% of the depth of the first metal line.

11. A method of forming a damascene interconnect on a first conductor having at least one side surface, the first conductor formed in a first dielectric layer, the method comprising:
    depositing a second dielectric layer on the first dielectric layer;
    etching the second dielectric layer to form a via in the second dielectric layer, the via overlapping the first conductor and a portion of the first dielectric at the top surface of the first dielectric layer;
    etching the first dielectric layer underlying the bottom of the via to form to form a cavity in the first dielectric layer that exposes a portion of a side surface of the first conductor; and
    filling the via and cavity with conductive material, such that the conductive material makes direct electrical contact with the exposed portion of the side surface of the first conductor and thereby obtain improved electrical contact with the first conductor.

12. The method as recited in claim 4 wherein filling the conductive material comprises depositing a barrier metal layer followed by copper and wherein the first conductor comprises a barrier metal layer exposed on the at least one side surface and a copper layer.

13. The method as recited in claim 11 wherein the first conductor is one of a contact and an interconnect line.

14. The method as recited in claim 11 wherein the first conductor is an interconnect line divided into two segments by a gap, each of the segments having a side surface facing the gap and wherein the cavity is formed in the gap and is configured such that at least one surface of the filled cavity makes direct electrical contact with at least one of the segment side surfaces facing the gap.

15. The method as recited in claim 11 wherein the first conductor is an interconnect line having a cutout resulting in a narrowing of its width and wherein the cavity is formed in the cutout and is configured such that at least one surface of the filled cavity makes direct electrical contact with at least one of the segment side surfaces facing the gap.

16. The method as recited in claim 11 wherein the first conductor is an interconnect line having a dielectric island contained within its top surface and wherein the etching of the first dielectric to form the cavity comprises etching the island.

17. The method as recited in claim 11 wherein the side surface of the first conductor is an external side of the first conductor.

18. The method as recited in claim 11 wherein the via has a diameter or width greater than the width of the first conductor and wherein the barrier film on at least one side of the filled cavity makes direct electrical contact with the barrier metal layer exposed on an outside side surface of the first conductor.

19. The method as recited in claim 11 wherein the depth of the cavity is between 80 and 100% of the depth of the first conductor, and wherein the first conductor is a metal interconnect line.

20. A method of forming a dual damascene interconnect, the method comprising:
    forming a conductive line in a first dielectric layer, wherein the conductive line is configured with a first barrier metal layer on at least one side surface of the conductive line, the first barrier metal layer positioned between the first dielectric and a copper core of the conductive line;
    forming a second dielectric layer on the first dielectric layer;
    etching the second dielectric layer to form a via in the second dielectric layer, wherein the bottom of the via overlies a portion of the conductive line and the dielectric surface portion of the first dielectric layer;
    extending the via by etching the first dielectric to form a cavity in the first dielectric, the cavity exposing the first barrier metal layer formed on at least one side surface of the conductive line enabling a subsequently deposited second barrier material layer to obtain improved electrical contact with the first conductor; and
    forming the second barrier metal layer in the via and cavity to create direct electrical contact between the first barrier metal layer on at least one side surface of the conductive line and the second barrier metal film; and
    filling the via and cavity with copper.

21. A method of forming a dual damascene interconnect structure in a semiconductor integrated circuit, the method comprising:
    forming a first dielectric layer on a substrate;
    patterning the first dielectric layer and depositing a conductive metal layer to form a first metal line at the top surface of the first dielectric;
    forming a second dielectric layer on the first dielectric layer;
    patterning and etching the second dielectric layer to form a via in the second dielectric layer;
    extending the via etch a first distance into the first dielectric layer to form a cavity extending beneath the bottom surface of the via formed in the first dielectric;
    depositing a conductive metal layer in the via and the cavity to form a via and a via projection, wherein the patterning of the cavity is defined at least in part by a feature patterned in the first metal line, and wherein further the feature is an island of dielectric formed in the first metal line.

22. The method recited in claim 21 wherein the island has one of square, circular, triangular, and rectangular shapes.

23. A method of forming a damascene interconnect on a first conductor having at least one side surface, the first conductor formed in a first dielectric layer, the method comprising:
    depositing a second dielectric layer on the first dielectric layer;
    etching the second dielectric layer to form a via in the second dielectric layer, the via overlapping the first conductor and a portion of the first dielectric at the top surface of the first dielectric layer;

etching the first dielectric layer underlying the bottom of the via to form a cavity in the first dielectric layer; and filling the via and cavity with conductive material, wherein the cavity is configured such that the conductive material makes direct electrical contact with a the at least one side surface of the first conductor wherein the first conductor is an interconnect line divided into two segments by a gap, each of the segments having a side surface facing the gap and wherein the cavity is formed in the gap and is configured such that at least one surface of the filled cavity makes direct electrical contact with at least one of the segment side surfaces facing the gap.

24. A method of forming a damascene interconnect on a first conductor having at least one side surface, the first conductor formed in a first dielectric layer, the method comprising;

depositing a second dielectric layer on the first dielectric layer;

etching the second dielectric layer to form a via in the second dielectric layer, the via overlapping the first conductor and a portion of the first dielectric at the top surface of the first dielectric layer;

etching the first dielectric layer underlying the bottom of the via to form a cavity in the first dielectric layer; and filling the via and cavity with conductive material, wherein the cavity is configured such that the conductive material makes direct electrical contact with a the at least one side surface of the first conductor, wherein the first conductor is an interconnect line having a cutout resulting in a narrowing of its width and wherein the cavity is formed in the cutout and is configured such that at least one surface of the filled cavity makes direct electrical contact with at least one of the segment side surface facing the gap.

25. A method of forming a damascene interconnect on a first conductor having at least one side surface, the first conductor formed in a first dielectric layer, the method comprising:

depositing a second dielectric layer on the first dielectric layer;

etching the second dielectric layer to form a via in the second dielectric layer, the via overlapping the first conductor and a portion of the first dielectric at the top surface of the first dielectric layer;

etching the first dielectric layer underlying the bottom of the via to form a cavity in the first dielectric layer; and filling the via and cavity with conductive material, wherein the cavity is configured such that the conductive material makes direct electrical contact with a the at least one side surface of the first conductor, wherein the first conductor is an interconnect line having a dielectric island contained within its top surface and wherein the etching of the first dielectric to form the cavity comprises etching the island.

* * * * *